(12) United States Patent
Grillo et al.

(10) Patent No.: US 7,279,984 B2
(45) Date of Patent: Oct. 9, 2007

(54) METHOD FOR DIFFERENTIAL-MODE PROCESSING OF AN INCIDENT VOLTAGE RELATIVE TO A REFERENCE VOLTAGE AND CORRESPONDING DEVICE

(75) Inventors: Lionel Grillo, Meylan (FR); William Thies, Belbeuf (FR)

(73) Assignee: STMicroelectronics SA, Montrouge (FR)

( * ) Notice: Subject to any disclaimer, the term of this patent is extended or adjusted under 35 U.S.C. 154(b) by 172 days.

(21) Appl. No.: 11/183,679

(22) Filed: Jul. 18, 2005

(65) Prior Publication Data

US 2006/0012437 A1    Jan. 19, 2006

(30) Foreign Application Priority Data

Jul. 19, 2004    (FR) ................... 04 07981

(51) Int. Cl.
   *H03F 3/08*    (2006.01)
(52) U.S. Cl. .................. 330/308; 330/253; 250/214 A
(58) Field of Classification Search ............... 330/86, 330/110, 253, 308; 250/214 A, 214 AG
   See application file for complete search history.

(56) References Cited

U.S. PATENT DOCUMENTS 5,451,902 A *   9/1995   Huang et al. ............... 330/253
5,581,212 A    12/1996   Huang et al. ............... 330/253
6,717,474 B2 *  4/2004   Chen et al. ................. 330/253

FOREIGN PATENT DOCUMENTS

EP   0 874 453   10/1998
FR   2 820 907    8/2002

OTHER PUBLICATIONS

Huang et al., A Wideband CMOS Transconductance-Transimpedance Amplifier, Dept. od Electronic Enigneering, Taiwan, vol. 1, 153-156, Dec. 27-30, 2003.*
Mohieldin et al., "A Fully Balanced Pseudo-Differential OTA with Common-Mode Feedforward and Inherent Common-Mode Feedback Detector", IEEE Journal of Solid-State Circuits, New York, USA; vol. 38, No. 4 Apr. 2004, pp. 663-664; XP-001158206.

* cited by examiner

*Primary Examiner*—Khanh Van Nguyen
(74) *Attorney, Agent, or Firm*—Lisa K. Jorgenson; Allen, Dyer, Doppelt, Milbrath & Gilchrist, P.A.

(57) ABSTRACT

A device for differential-mode processing of an incident voltage relative to a reference voltage includes a differential circuit including a voltage/current conversion block having a differential input, designed to receive the incident voltage at a first input and the reference voltage at a second input. A current amplification block includes a gain module and a current subtraction module. A current/voltage conversion block includes an operational amplifier with differential transimpedance supplied with a common-mode voltage, receiving the two currents output from the amplification block at its input, and delivering two calibrated opposing voltages at its output that are centered around the common-mode voltage.

9 Claims, 10 Drawing Sheets

METHOD FOR DIFFERENTIAL-MODE PROCESSING OF AN INCIDENT VOLTAGE RELATIVE TO A REFERENCE VOLTAGE AND CORRESPONDING DEVICE

FIELD OF THE INVENTION

The invention relates to voltage signal processing circuits, in particular those designed to deliver, from an incident signal, an output signal in a predetermined voltage range.

BACKGROUND OF THE INVENTION

The invention may be applied advantageously, but is not limited to, the reading of an optical signal, in particular in optical disk reader systems. In these systems, the processing circuit is situated between a photodetector and an analog-digital converter to adapt the signal coming from the photodetector to the input range of the analog-digital converter. The amplitude of the incident voltage can vary depending on the quantity of light emitted by the reader system laser and received by the processing circuit. This quantity of light can vary because of defects in optical disks and voltage offsets generated by the various components of the circuit.

An approach developed by the Applicant in the Patent FR-2 820 307 proposes an asymmetric processing circuit. This processing circuit, with 'single-end' architecture, notably has a variable-gain converter followed by a current/voltage converter. But, at the output of the current/current converter, the current level can be very high and incompatible with the input range of the voltage/current converter. This circuit therefore includes two compensation circuits as an approach to this problem. However, such an approach turns out to be relatively complex to implement. Moreover, such a processing circuit is a source of harmonic distortion. In addition, it has a relatively low noise-rejection ratio and the structure has a stability problem at very high frequency.

SUMMARY OF THE INVENTION

An object of the invention is to address the above-described problem and transform an incident voltage such that it is in the input range of an analog-digital converter.

Another object of the invention is to reduce the harmonic distortion of the device and to ensure an optimal rejection ratio. For this purpose, the invention provides that a processing circuit be used in differential mode, in other words by processing a signal resulting from the difference between an incident voltage, for example linked to the read signal from the optical disk, and a reference voltage.

According to the invention, a method is used for differential-mode processing of an incident voltage relative to a reference voltage including: a voltage/current conversion delivering two opposing currents corresponding to the difference between the incident voltage and the reference voltage; an amplification of these currents with a gain selected from within a predetermined range of gains, and an elimination of the DC component of the amplified currents, so as to obtain two resulting currents; and a current/voltage conversion of the resulting currents into a differential output voltage centered around a common-mode voltage.

In other words, from a differential voltage generated as a function of an incident voltage, for example linked to the optical disk read signal, and a reference voltage, for example specific to the reader system used, two opposing currents are obtained via a voltage-current converter. The two opposing currents are amplified via a current amplifier, to reach the maximum value of the input range of the analog-digital converter connected to the output of the current/voltage amplifier, then the DC component of these opposing currents is eliminated so as to be free of its variations and to deliver a current level compatible with the input range of the current/voltage converter.

This method has, in particular, the advantage of processing currents rather than voltages which offers a higher stability for the circuit over the gain range to be processed. Moreover, the use of a current amplifier facilitates the operation in differential mode, whereas a voltage amplifier implies a much more complex circuit that is more difficult to stabilize for a same gain range.

According to one embodiment, the elimination of the DC component of the amplified currents comprises a division by two of the amplitude of the two amplified currents, followed by two subtractions, each one being between the two thus divided amplified signals, so as to obtain the two resulting currents. Such an embodiment is particularly simple to implement and also avoids, notably, the use of compensation circuits such as those described in the document FR 2 820 307.

A subject of the invention is also a device for differential-mode processing of an incident voltage relative to a reference voltage, comprising a differential circuit including: a voltage/current conversion block having a differential input designed to receive the incident voltage at a first input and the reference voltage at a second input, and designed to deliver at its output two opposing currents corresponding to the difference between the incident voltage and the reference voltage; a current amplification block comprising a gain module and a current subtraction module, the amplification block receiving the two currents output from the voltage/current conversion block at its input and delivering two opposing currents centered around zero at its output; and a current/voltage conversion block comprising an operational amplifier with differential transimpedance supplied with a common-mode voltage, receiving the two currents output from the amplification block at its input and delivering two calibrated opposing voltages at its output that are centered around the common-mode voltage.

According to one embodiment, the subtraction module comprises two sub-modules that are each designed to receive at their inputs the amplified currents output from the gain module and whose amplitude is divided by two, and each designed to deliver at their outputs two currents in phase opposition, centered around zero and with no DC component.

Another subject of the invention is an optical signal reader system comprising a processing device such as that defined above.

BRIEF DESCRIPTION OF THE DRAWINGS

Other advantages and features of the invention will become apparent upon examination of the detailed description of one non-limiting embodiment of the invention, and of the appended drawings.

DETAILED DESCRIPTION OF THE PREFERRED EMBODIMENTS

Figure 1:
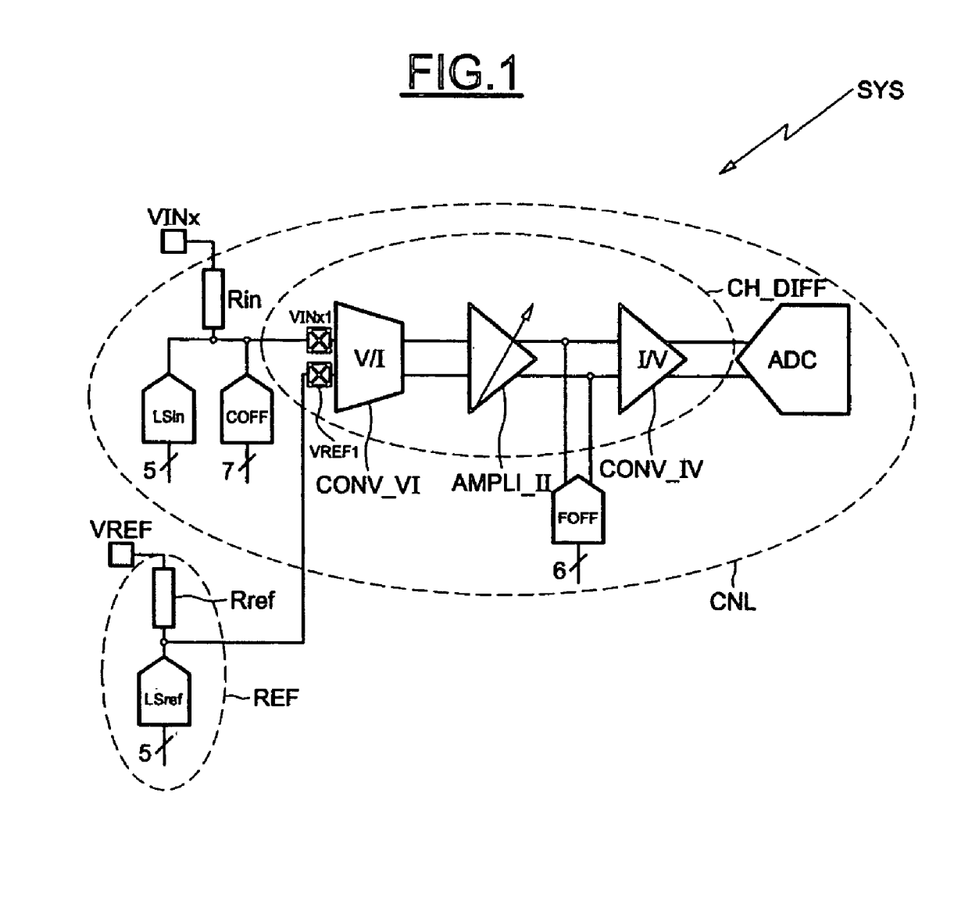
FIG. 1 is a schematic diagram illustrating an embodiment of a differential-mode processing device according to the invention.

A system SYS according to the invention is shown in FIG. 1. In the example described here, this device is connected to the output of a photodetector (not shown) that is integrated, for example, into an optical disk reader system, such as an audio or video digital disk. The photodetector comprises an optical lens divided into several quadrants. The number of quadrants depends on the type of optical lens used. Each quadrant of the optical lens generates an incident voltage signal VINx, representing the data item read by the reader system.

The reference CNL represents a channel of the device according to the invention designed to process the signal VINx generated by one quadrant of the optical lens. There are therefore as many channels CNL as there are signals generated by the optical lens. To simplify the figure, only one channel CNL is shown. The block REF allows a reference signal VREF, characteristic of the reader system, to be generated. The signal VREF is identical for each channel CNL. The block REF has an input resistor Rref and offset block or means LSref, using 5-bit encoding, capable of producing a voltage offset in the reference voltage Vref that will depend on the component technology used.

At its input, the channel CNL receives, at an input resistor Rin, the incident voltage VINx output from the respective quadrant of the optical lens. The channel CNL comprises offset block or means LSin, using 5-bit encoding, capable of producing a voltage offset in the incident voltage VINx that will depend on the component technology used. It also comprises a correction block or means COFF (Coarse OFFset), using 7-bit encoding, capable of effecting a first coarse correction by applying a correction voltage to correct potential variations in the incident voltage VINx caused, for example, by defects in the optical disk.

The channel CNL comprises a differential circuit CH_DIFF for processing the incident voltage VINx. The differential circuit CH_DIFF receives at its input, on the one hand, the incident voltage VINx, corrected by the offset means LSin and the correction means COFF, and on the other hand, the reference voltage VREF, corrected by the offset means LSref.

The differential circuit CH_DIFF comprises three blocks. A first block CONV_VI performs a voltage/current conversion to obtain a differential current from the voltages VINx1 and VREF1, respectively originating from the voltages VINx and VREF. A second block AMPLI_II amplifies the differential current delivered by the converter CONV_VI and performs a subtraction operation to obtain a differential current whose DC component is zero. A third block CONV_IV converts the differential current, output from the amplification block AMPLI_II, into a differential voltage. These three blocks will be described in more detail below.

A correction block or means FOFF (Fine OFFset), using 6-bit encoding, is connected in parallel with the differential circuit CH_DIFF at the output of the amplification block AMPLI_II. These correction means FOFF allow an offset voltage to be applied to provide a fine correction for the voltage variations created, notably, by the differential circuit CH_DIFF. At the output of the differential circuit, an analog/digital converter ADC receives the differential voltage delivered by the current/voltage converter CONV_IV. The converter ADC digitizes the signal; this operation can be effected in different ways depending on the circuit architecture of the application.

Figure 2:
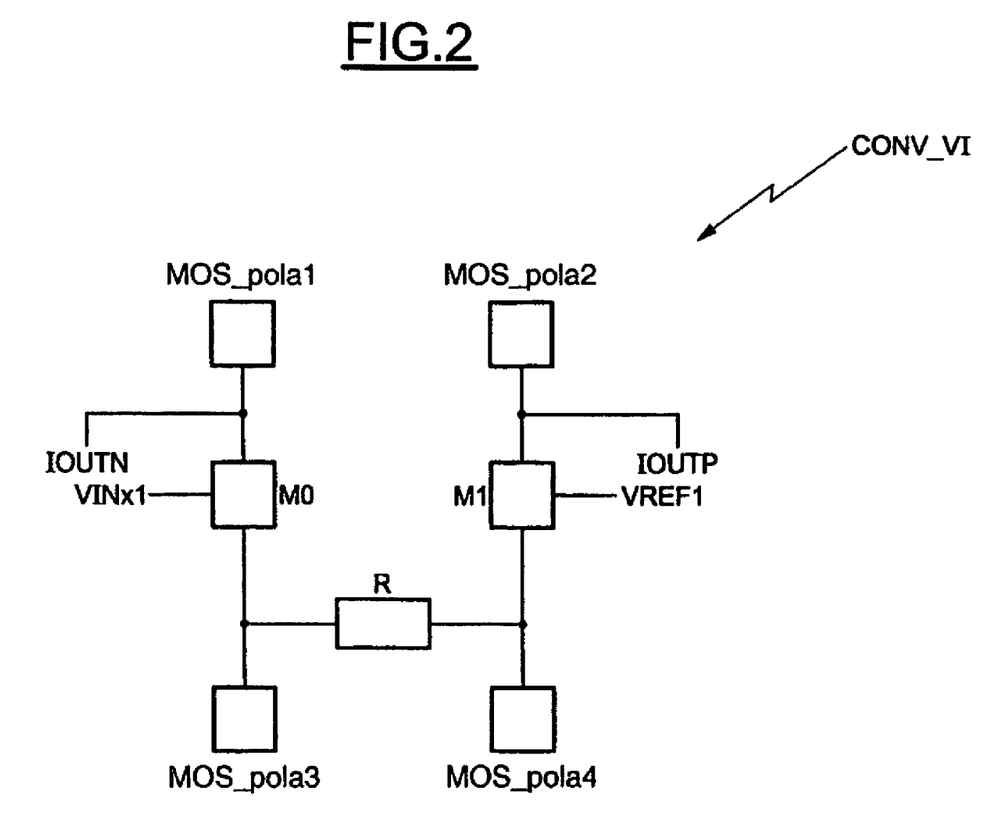
FIG. 2 is a schematic diagram illustrating in more detail an example of a part of the differential-mode processing device of FIG. 1.

Reference is now made to FIG. 2 which shows the voltage/current converter CONV_VI in more detail. The converter CONV_VI receives the incident VINx1 and reference VREF1 voltages at the gates of two transistors M0 and M1, respectively. The transistors M0 and M1, connected together via a resistor R, are biased by the biasing transistors MOS_pola1, MOS_pola2, MOS_pola3 and MOS_pola4. The transistors MOS_pola1 and MOS_pola3 are connected to the transistor M0. The other transistors MOS_pola2 and MOS_pola4 are connected to the transistor M1.

At their outputs, the transistors M0 and M1 deliver, via their drains, two opposing currents, respectively IOUTN and IOUTP. The value of the DC components of these currents is fixed by the value of the biasing currents delivered by the biasing transistors MOS_pola1, MOS_pola2, MOS_pola3 and MOS_pola4. The value of the AC components of these currents is determined by the difference between the incident VINx1 and reference VREF1 voltages, divided by the value of the resistor R.

Figure 3A:
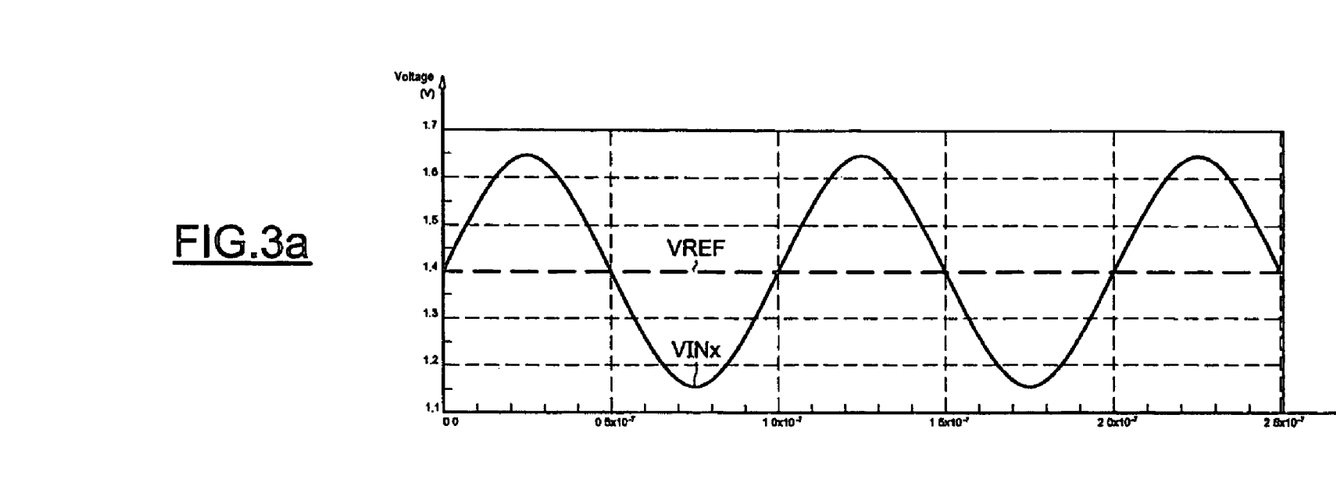
FIGS. 3*a* and 3*b* are timing diagrams illustrating respective input signals and output signals generated by the module shown in FIG. 2.

FIG. 3a shows an example of incident VINx and reference VREF voltages. The incident voltage VINx here has a peak-to-peak amplitude of around 0.5 V, and is centered on the reference voltage VREF that has a value of 1.4 V. For this range of voltage, the device according to the invention has a low distortion ratio.

Figure 3B:
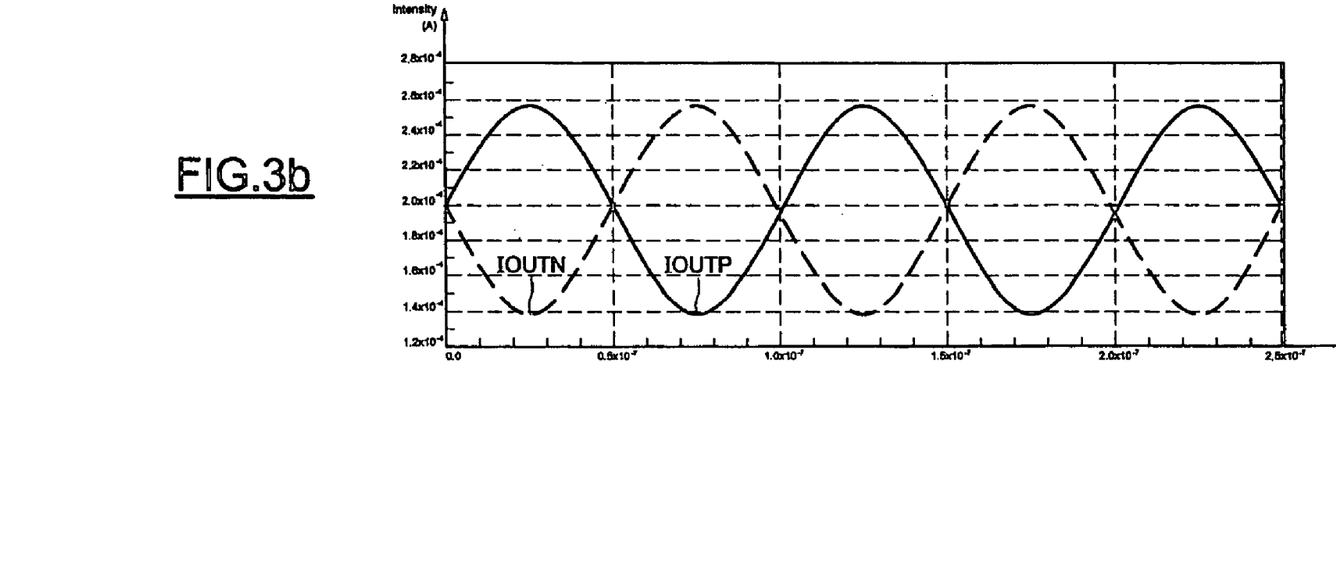

FIG. 3b shows the output currents IOUTP and IOUTN from the block CONV_VI, obtained from the input voltages VINx and VREF shown in FIG. 3a, where the value of R is equal to 3.5 kOhms. The currents IOUTP and IOUTN are opposing and have an amplitude of $2.57 \times 10^{-4}$ A for the values of VINx, VREF and R given.

The currents IOUTP and IOUTN are delivered at the input of the amplification block AMPLI_II. The amplification block AMPLI_II comprises two modules performing two distinct operations: a gain module and a current subtraction module.

Figure 4:
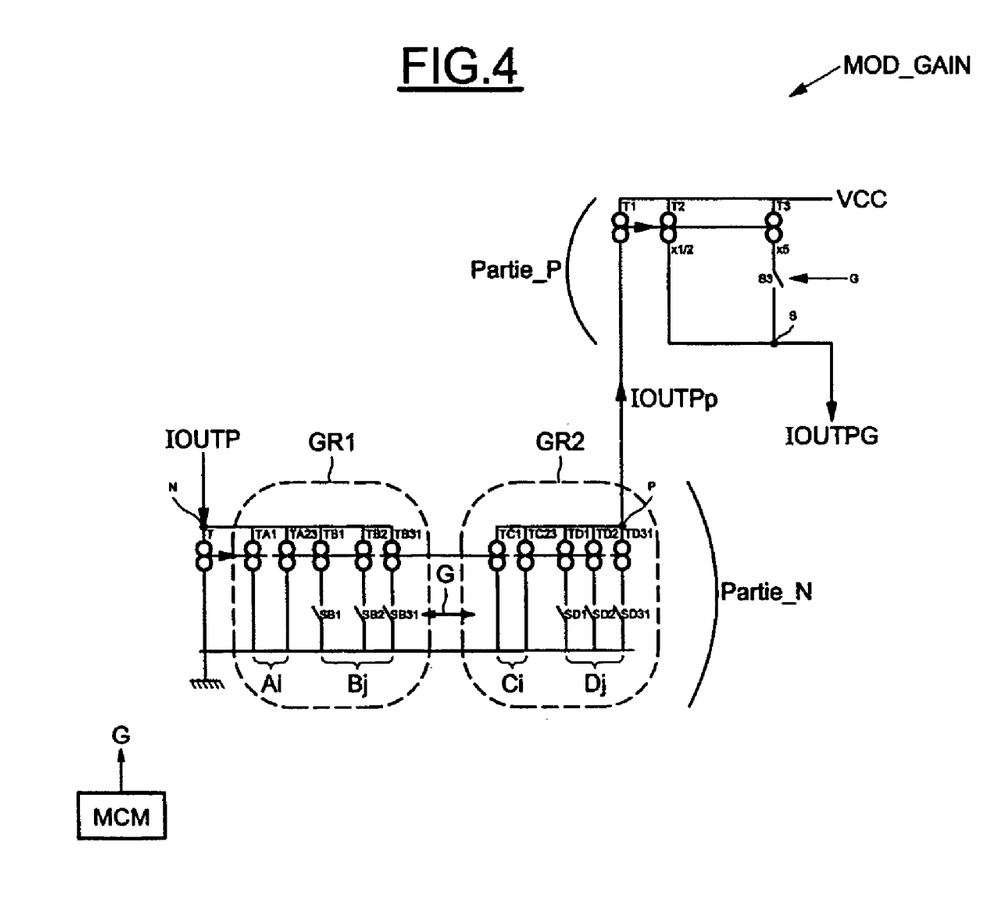
FIG. 4 is a schematic diagram illustrating in more detail, another part of the differential-mode processing device of FIG. 1.

FIG. 4 shows an embodiment of the gain module MOD_GAIN. This gain module MOD_GAIN comprises two symmetrical parts, one for the amplification of the current IOUTP and the other for the amplification of the current IOUTN. To simplify the figure, only the part for amplifying the current IOUTP is shown. The gain module MOD_GAIN is formed from two parts: the part Partie_N comprising n-MOS transistors configured as current mirrors and the part Partie_P comprising p-MOS transistors also configured as a current mirror.

The part Partie_N comprises an input node N receiving the current to be amplified, here IOUTP. A transistor T, configured as a diode, couples the node N to ground. 23 branches Ai, where i goes from 1 to 23, link the node to ground. Each branch Ai is formed by a transistor TAi. The gate of each of the transistors TAi is connected to the gate of the transistor T. Each transistor TAi forms a current mirror with the transistor T. The node N is also connected to ground via 31 identical branches Bj, where j goes from 1 to 31. Each branch Bj comprises a transistor TBj in series with a controlled switch SBj. The gate of each transistor TBj is connected to the gate of the transistor T. The switches SBj can be controlled independently of each other. The assembly comprising the transistors TAi and TBj forms a first group for controlling the gain GR1.

In this exemplary application, the current flowing through the first group GR1 and the transistor T is equal to IOUTP/(55−G), where the gain G is equal to the number of switches SBj that are open. When all the switches SBj are open, then G=31 and the current flowing through the first group GR1 and the transistor T is equal to IOUTP/24. When all the switches SBj are closed, G=0 and the current flowing through the first group GR1 and the transistor T is equal to IOUTP/55.

A node P forms the output of the module Partie_N. 23 branches Ci, connected in parallel, link the node P to ground. Each branch Ci is formed by a transistor TCi. Each transistor TCi has its gate connected to the gate of the transistor T. The node P is also coupled to ground via 31 identical branches Dj. Each branch Dj comprises a transistor TDj in series with a controlled switch SDj. The gate of each transistor TDj is connected to the gate of the transistor T. The switches SBj and SDj are controlled such that if a switch SBj is open, the corresponding switch SDj is closed and vice versa. The assembly of the transistors TCi and TDj forms a second group for controlling the gain GR2. The current IOUTPp flowing through the second group GR2 is then equal to IOUTPp=(IOUTP/(55−G))*(23+G).

The part Partie_P has its input connected to the node P. The part Partie_P comprises 3 transistors T1, T2 and T3. The transistor T1 is connected as a diode. Its drain is connected to the node P and its source is connected to the power supply voltage VCC. The transistor T2 has its source connected to the power supply voltage VCC and its drain to a node S forming the output of the gain module MOD_GAIN. The gate of the transistor T2 is connected to the gate of the transistor T1. The assembly of the transistors T1 and T2 forms a current mirror. The geometry of the transistors T1 and T2 is chosen such that the current flowing through the transistor T2 is equal, in this example, to half the current IOUTPp.

The transistor T3 has its source connected to the power supply voltage VCC and its drain to the node S via a switch S3 controlled by the gain signal G. The gate of the transistor T3 is connected to the gate of the transistor T1. The transistors T1 and T3 form a current mirror. The geometry of the transistors T1 and T3 is chosen such that the current flowing through the transistor T3 is equal, in this example, to 5 times the current IOUTPp. By controlling the opening and closing of the switches SBj, SDj and S3, the gain of the amplifier AMPLI_II can vary from a minimum value equal to 0.5×23/55, or around 0.21, up to a maximum value equal to 5.5×54/24, or around 12.4.

The adjustment of the gain G is effected by suitable control block or means MCM that are known per se and that are readily implemented by those skilled in the art, for example in the form of logic circuits or a digital module. For example, this digital module coupled to the output of the circuit will regulate the gain G automatically. Furthermore, the gain G of the amplifier AMPLI_II uses a 6-bit encoding, the 5 least-significant bits controlling the part Partie_N and the most-significant bit controlling the switch S3. According to the embodiment chosen, the gain G of the amplifier varies in a monotonic fashion. Such a structure, referred to as decibel linear, is especially advantageous since the gain is easily adjusted by a digital procedure.

Figure 5:
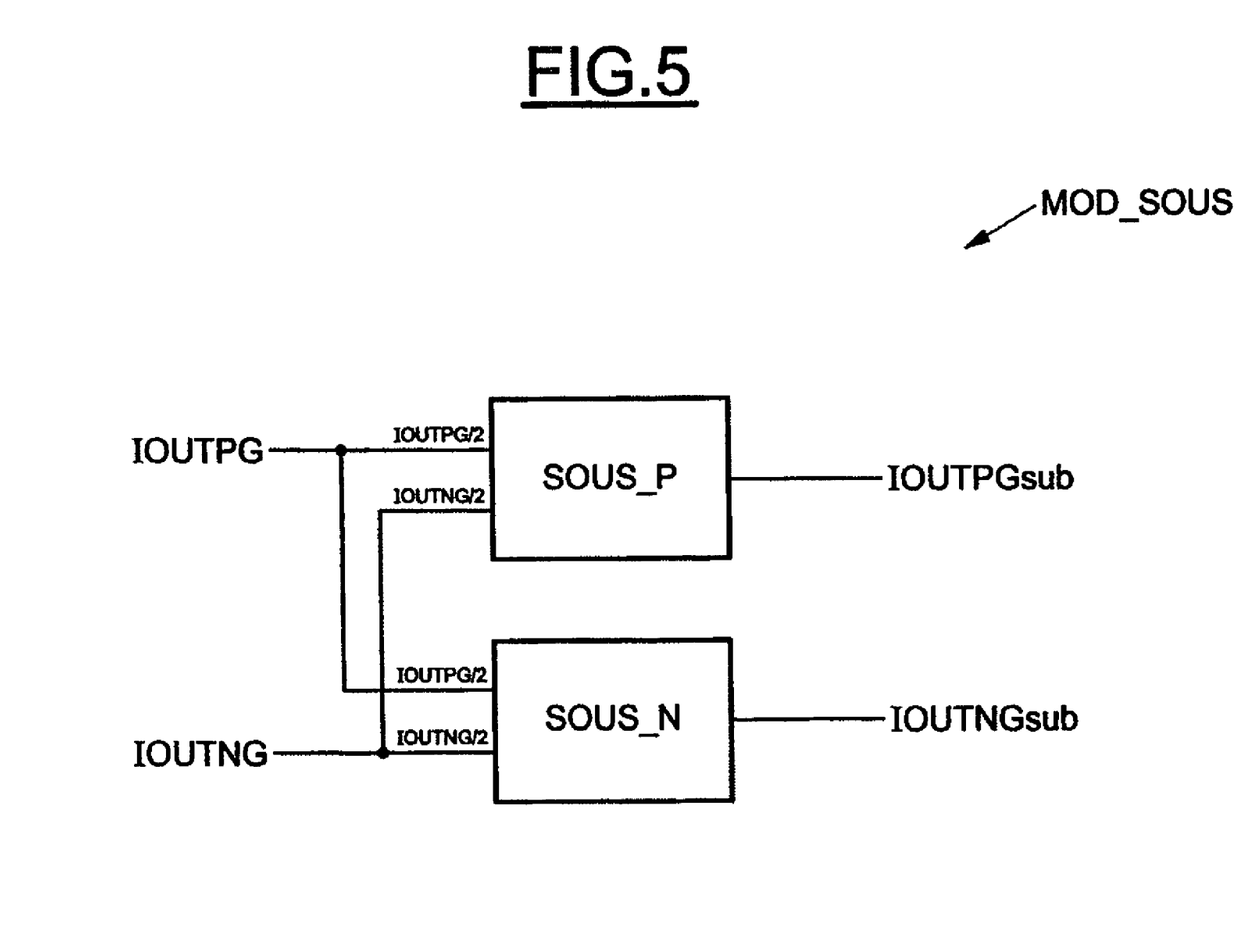
FIG. 5 is a schematic diagram illustrating in more detail, another part of the differential-mode processing device of FIG. 1.

Reference is now made to FIG. 5 which shows the subtraction module MOD_SOUS of the amplifier AMPLI_II. The subtraction module MOD_SOUS is connected to the output of the gain module MOD_GAIN and receives at its input the currents IOUTPG and IOUTNG output from the gain module MOD_GAIN. The subtraction module MOD_SOUS comprises two blocks SOUS_P and SOUS_N each receiving at its input the currents IOUTPG and IOUTNG divided by 2. Each block SOUS_P and SOUS_N performs the subtraction between the two input currents IOUTPG and IOUTNG divided by 2. The blocks SOUS_P and SOUS_N deliver the currents IOUTPsub and IOUTNsub at their outputs.

Figure 6:
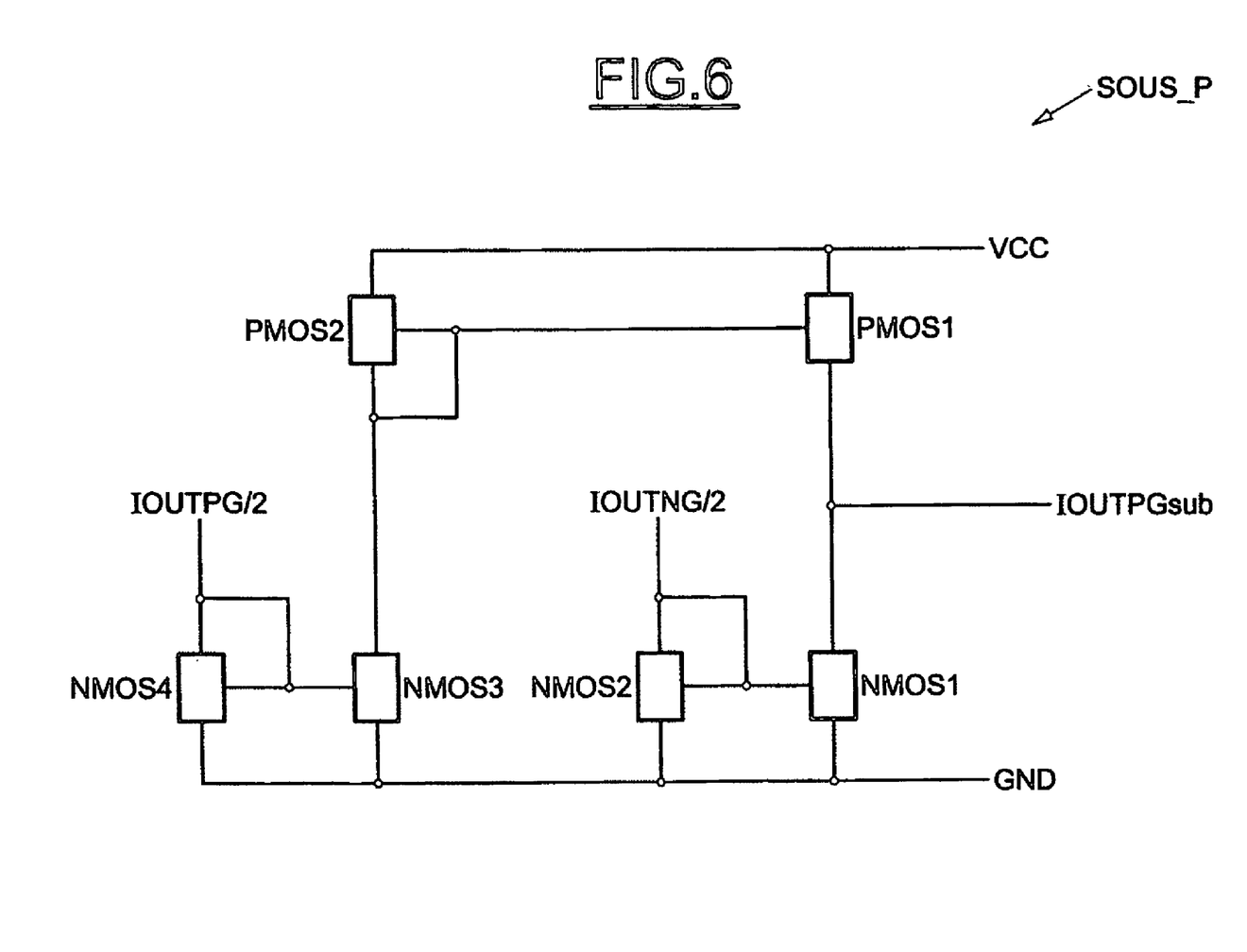
FIG. 6 is a schematic diagram illustrating in more detail, a module of the part shown in FIG. 5.

FIG. 6 shows the block SOUS_P in more detail. The structure of the block SOUS_N is identical, the roles of the currents IOUTPG and IOUTNG being reversed. The block SOUS_P comprises three current mirrors. Two n-MOS transistors, NMOS1 and NMOS2 form a first current mirror. Their respective sources are connected to ground GND and their gates are connected together. In addition, the gate of the transistor NMOS2 is fed back to its drain. The transistor NMOS2 receives the input current IOUTNG/2 at its source.

The first current mirror NMOS1, NMOS2 is connected to a second current mirror formed by the p-MOS transistors, PMOS1 and PMOS2. The two current mirrors are connected through the drain of NMOS1 that is connected to the drain of PMOS1. The transistors PMOS1 and PMOS2 are connected together by their gates, and their sources are connected to the power supply voltage VCC. The gate of the transistor PMOS2 is fed back to its drain which is connected to the third current mirror of the block SOUS_P. The third current mirror is formed from two n-MOS transistors, NMOS3 and NMOS4. Their sources are connected to ground GND. The drain of the transistor NMOS3 is connected to the second current mirror PMOS1, PMOS2. The gate of the transistor NMOS4 is fed back to its drain and connected to the gate of the transistor NMOS3. In addition, the transistor NMOS4 receives the input current IOUTPG/2 at its drain. The drain of the transistor NMOS1 forms the output of the block SOUS_P which delivers the current IOUTPGsub.

Figure 7:
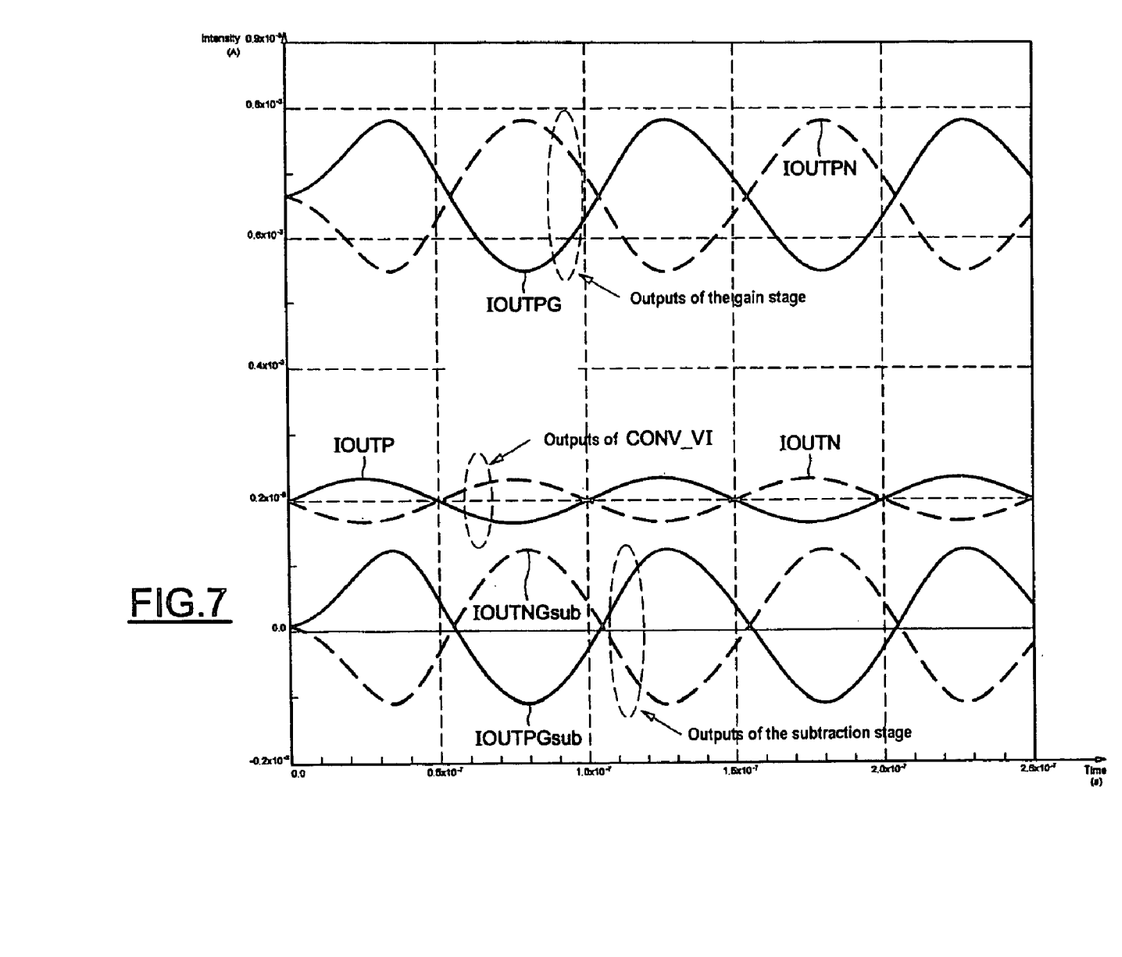
FIG. 7 is a timing diagram illustrating the behavior of the signals generated by the modules in FIGS. 4 and 5.

Reference is now made to FIG. 7 that shows the behavior as a function of time of the currents between the converter CONV_VI and the amplifier AMPLI_II, during a new simulation example. The curves IOUTP and IOUTN show the currents at the output of the converter CONV_VI. The currents IOUTP and IOUTN are opposing and have a peak-to-peak amplitude of around 0.074 mA. The DC component of the currents IOUTP and IOUTN is around 0.2 mA.

The curves IOUTPG and IOUTPN show the currents at the output of the gain amplification module MOD_GAIN of the amplifier AMPLI_II. The currents IOUTPG and IOUTNG are opposing and have a peak-to-peak amplitude of around 0.22 mA. The DC component of the currents IOUTPG and IOUTNG is around 0.66 mA. The curves IOUTPGsub and IOUTNGsub show the currents at the output of the subtraction module MOD_SOUS of the amplifier AMPLI_II. The currents IOUTPGsub and IOUTNGsub are opposing and have a peak-to-peak amplitude of around 0.22 mA. The DC component of the currents IOUTPGsub and IOUTNGsub is zero since the subtraction was per-formed between the two currents IOUTPG and IOUTPN that had DC components of the same value. Moreover, since the amplitude of the input currents of the blocks SOUS_P and SOUS_N corresponds to half the currents IOUTPG and IOUTNG, the amplitude of the currents IOUTPGsub and IOUTNGsub is identical to that of the currents IOUTPG and IOUTNG.

Figure 8:
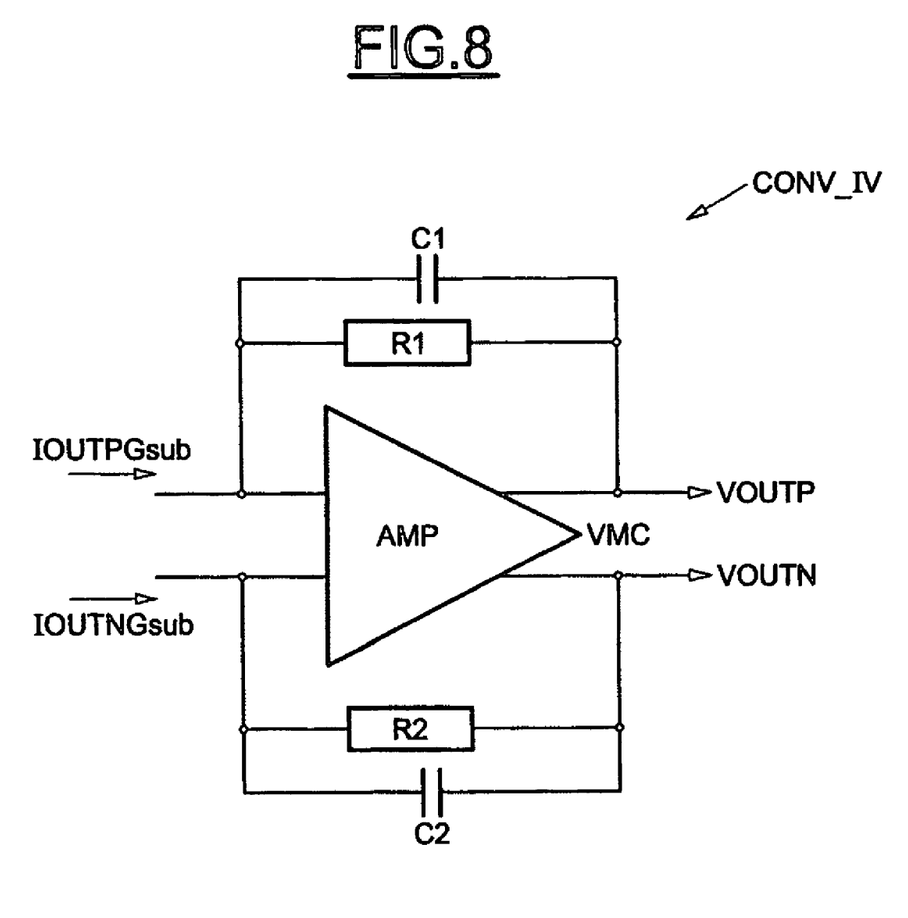
FIG. 8 is a schematic diagram illustrating in more detail, another part of the differential-mode processing device of FIG. 1.

Reference is now made to FIG. 8 that shows an exemplary embodiment of the converter CONV_IV according to the invention. The converter CONV_IV comprises an amplifier AMP supplied with a common-mode voltage VCM, for example equal to half the power supply voltage. The amplifier AMP receives at its input the two currents IOUTPGsub and IOUTNGsub delivered by the current amplifier AMPLI_II. The amplifier AMP generates two output voltages VOUTP and VOUTN. A resistor R1 mounted in parallel with a capacitor C1 and a resistor R2 mounted in parallel with a capacitor C2 are connected between each input and its associated output of the amplifier AMP.

Figure 9:
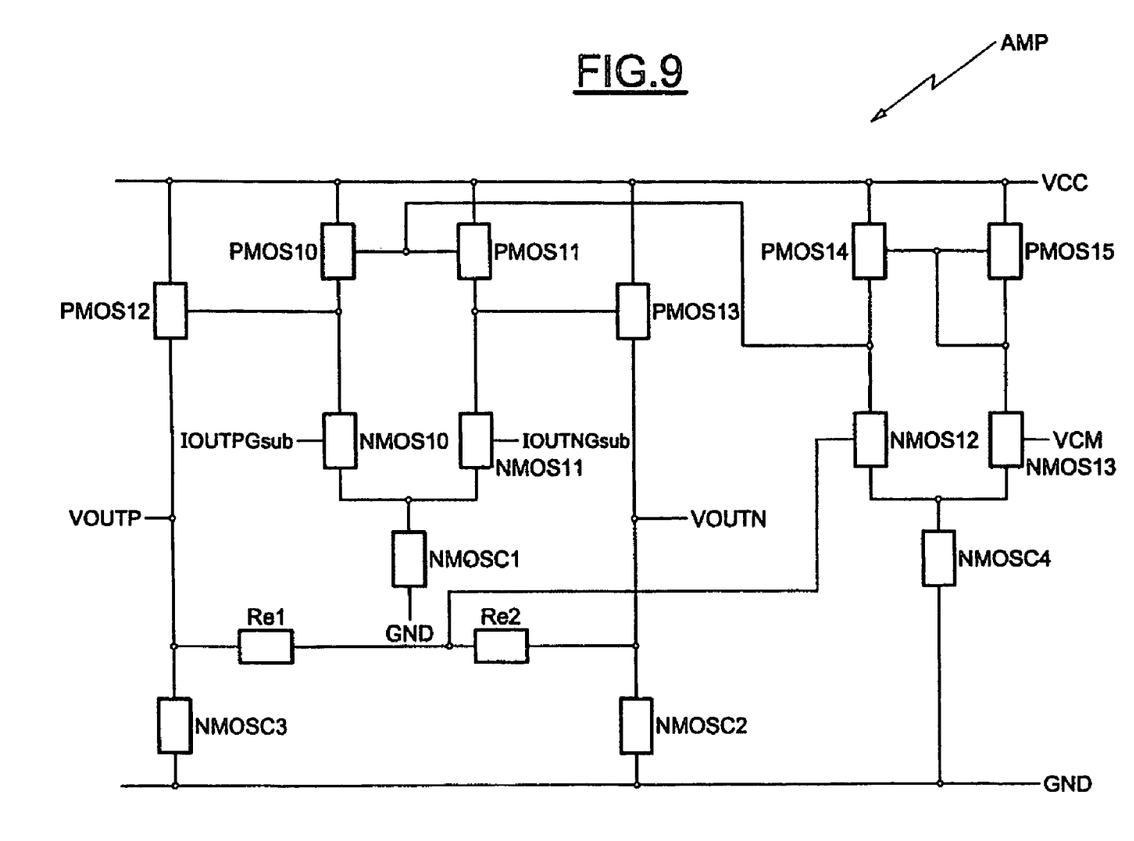
FIG. 9 is a schematic diagram illustrating in more detail, the module shown in FIG. 8.

FIG. 9 illustrates an example of the structure of the amplifier AMP in more detail. The amplifier AMP comprises four n-MOS transistors, NMOSC1, NMOSC2, NMOSC3 and NMOSC4 configured as current sources. Their sources are connected to ground GND. The drains of the transistors NMOSC2 and NMOSC3 are connected via two resistors Re1 and Re2 in series. The transistor NMOSC1 is connected to a differential pair of n-MOS transistors, NMOS10 and NMOS11 receiving at their gates the input currents IOUTPGsub and IOUTNGsub output from the subtraction module MOD_SOUS of the current amplifier AMPLI_II.

The drains of the differential pair NMOS10 and NMOS11 are connected to the drains of p-MOS transistors of another differential pair, PMOS10 and PMOS11. The sources of the transistors PMOS10 and PMOS11 are connected to the power supply voltage VCC and their gates are connected together. The drain of the transistor PMOS10 is connected to the gate of another p-MOS transistor, PMOS12. The source of the transistor PMOS12 is connected to the power supply voltage VCC and its drain is connected to the current source NMOSC3. In addition, the transistor PMOS12 delivers the output voltage VOUTP from its drain.

The drain of the transistor PMOS11 is connected to the gate of another p-MOS transistor, PMOS13. The transistor PMOS13 is connected by its source to the power supply voltage VCC and by its drain to the current source NMOSC2. In addition, the transistor PMOS13 delivers the output voltage VOUTN from its drain.

The common gate of the transistors PMOS10 and PMOS11 is connected to a p-MOS transistor, PMOS14 that forms a current mirror with another p-MOS transistor, PMOS15. The sources of the transistors PMOS14 and PMOS15 are connected to the power supply voltage VCC. The gate of the transistor PMOS14 is connected to that of the transistor PMOS15. In addition, the gate of the transistor PMOS15 is fed back to its drain.

The current mirror PMOS14 and PMOS15 is connected to a differential pair of n-MOS transistors, NMOS12 and NMOS13. The current mirror NMOS12, NMOS13 is connected to the current source NMOSC4. The gate of the transistor NMOS12 is connected to the common node of the resistors Re1 and Re2. The gate of the transistor NMOS13 receives the common-mode voltage, VCM.

Figure 10A:
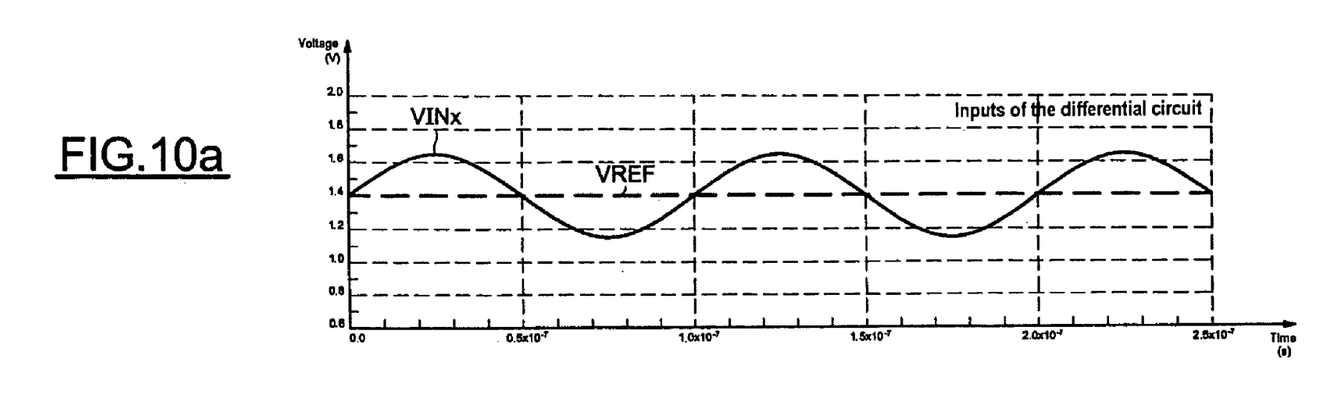
FIGS. 10a and 10b are timing diagrams respectively showing the input and output signals of the differential-mode processing device according to the invention.
Figure 10B:
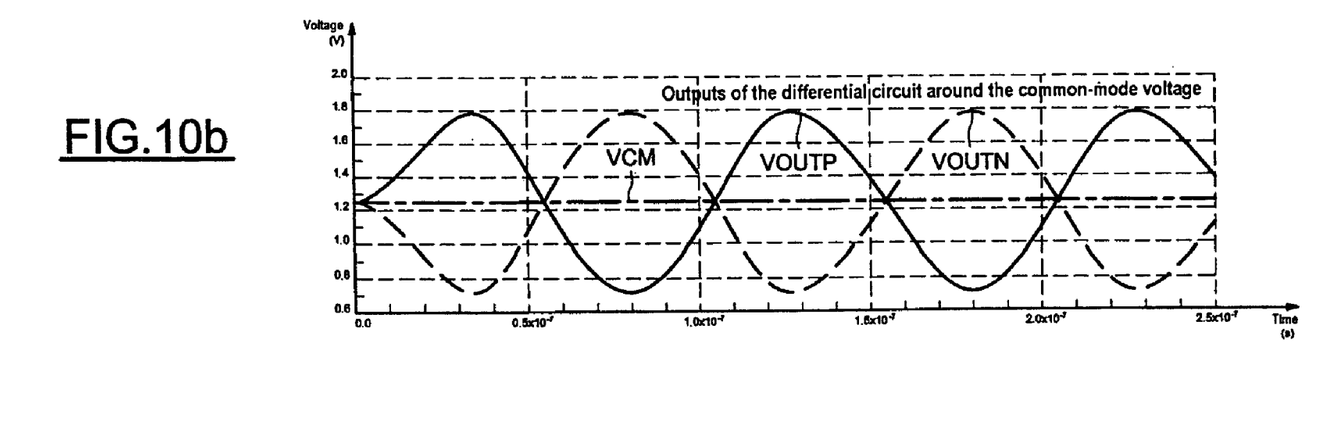

Reference is now made to FIGS. 10a and 10b. FIG. 10a shows the input signals VREF and VINx. In this example, the value of VREF is around 1.4 V. The peak-to-peak amplitude of VINx is around 0.45 V and its DC component is equal to around 1.4 V. FIG. 10b shows the output signals of the differential circuit CH_DIFF according to the invention, the input signals being those shown in FIG. 10a. The voltages VOUTP and VOUTN are opposing and each have an amplitude of around 1 V. The voltages are centered around the common-mode voltage VCM which is around 1.25 V.

That which is claimed is:

1. A method for differential-mode processing of an incident voltage relative to a reference voltage and comprising:
    a voltage/current conversion delivering two opposing currents corresponding to a difference between the incident voltage and the reference voltage;
    an amplification of the two opposing currents with a gain selected from within a range of gains, and an elimination of a DC component of the two amplified opposing currents, so as to obtain two resulting currents; and
    a current/voltage conversion of the resulting currents into a differential output voltage centered around a common-mode voltage.

2. The method according to claim 1, wherein the elimination of the DC component of the two amplified opposing currents comprises a division by two of an amplitude of the two amplified opposing currents, and subtractions between the divided amplified signals, so as to obtain the two resulting currents.

3. A method for processing a voltage signal from a photodetector comprising:
    generating two opposing currents based upon a difference between the voltage signal and a reference voltage signal;
    amplifying the two opposing currents and eliminating a DC component of the two amplified opposing currents to obtain two resulting currents; and
    converting the resulting currents into a differential output voltage centered around a commonmode voltage.

4. The method according to claim 3, wherein eliminating the DC component of the two amplified opposing currents comprises dividing an amplitude of the two amplified opposing currents, and subtracting the divided amplified signals, to obtain the two resulting currents.

5. The method according to claim 3, wherein amplifying the two opposing currents comprises amplifying with a gain selected from within a range of gains.

6. A device for differential-mode processing an incident voltage relative to a reference voltage, the device comprising:
    a voltage/current conversion block having a differential input to receive the incident voltage at a first input and the reference voltage at a second input, and to deliver at an output two opposing currents corresponding to the difference between the incident voltage and the reference voltage;
    a current amplification block receiving the two opposing currents output from the voltage/current conversion block and outputting two amplified opposing currents centered around zero; and
    a current/voltage conversion block comprising an operational amplifier with differential transimpedance supplied with a common-mode voltage, receiving the two amplified opposing currents output from the amplification block and generating two calibrated opposing voltages that are centered around the common-mode voltage.

7. The device according to claim 6, wherein the current amplification block comprises a gain module and a current subtraction module, the subtraction module receiving the two amplified opposing currents output having an amplitude divided by two from the gain module, and outputting two currents in phase opposition, centered around zero and with no DC component.

8. An optical signal reader system comprising:
a photodetector generating an incident voltage signal; and
a device for processing the incident voltage signal relative to a reference voltage, the device comprising:
  a voltage/current conversion block having a differential input to receive the incident voltage and the reference voltage, and to deliver two opposing currents corresponding to the difference between the incident voltage and the reference voltage,
  a current amplification block receiving the two opposing currents output from the voltage/current conversion block and outputting two amplified opposing currents centered around zero, and
  a current/voltage conversion block comprising an operational amplifier with differential transimpedance supplied with a commonmode voltage, receiving the two amplified opposing currents output from the amplification block and generating two calibrated opposing voltages that are centered around the common-mode voltage.

9. The system according to claim 8, wherein the current amplification block comprises a gain module and a current subtraction module, the subtraction module receiving the two amplified opposing currents output having an amplitude divided by two from the gain module, and outputting two currents in phase opposition, centered around zero and with no DC component.

\* \* \* \* \*

UNITED STATES PATENT AND TRADEMARK OFFICE
CERTIFICATE OF CORRECTION

PATENT NO.         : 7,279,984 B2
APPLICATION NO. : 11/183679
DATED              : October 9, 2007
INVENTOR(S)        : Grillo et al.

It is certified that error appears in the above-identified patent and that said Letters Patent is hereby corrected as shown below:

Column 8, Line 35        Delete: "to commonmode"
                         Insert: -- common-mode --

Column 10, Line 3        Delete: "to commonmode"
                         Insert: -- common-mode --

Signed and Sealed this

Twenty-seventh Day of May, 2008

JON W. DUDAS
*Director of the United States Patent and Trademark Office*